(12) United States Patent
Hsieh

(10) Patent No.: US 8,421,645 B2
(45) Date of Patent: Apr. 16, 2013

(54) ELECTROSTATIC PROTECTOR OF PORTABLE ELECTRONIC DEVICES

(75) Inventor: Hsing-Yuan Hsieh, Shindian (TW)

(73) Assignee: FIH (Hong Kong) Limited, Kowloon (HK)

( * ) Notice: Subject to any disclaimer, the term of this patent is extended or adjusted under 35 U.S.C. 154(b) by 417 days.

(21) Appl. No.: 12/784,502

(22) Filed: May 21, 2010

(65) Prior Publication Data

US 2011/0012747 A1    Jan. 20, 2011

(30) Foreign Application Priority Data

Jul. 15, 2009   (CN) .......................... 2009 1 0304382

(51) Int. Cl.
*G08B 5/22*        (2006.01)
*G08B 21/00*       (2006.01)
*H05F 1/00*        (2006.01)

(52) U.S. Cl.
USPC ...... 340/815.45; 340/635; 340/660; 361/212; 361/220

(58) Field of Classification Search .................. 340/635, 340/636.12, 636.15–636.17, 649, 651, 653–654, 340/657, 660–662, 815.45, 659; 361/18, 361/21, 33, 54, 56, 58, 60, 88, 91.1–91.7, 361/117, 212, 220
See application file for complete search history.

(56) References Cited

U.S. PATENT DOCUMENTS

| 4,210,906 | A  | * | 7/1980 | Smith et al. ................... 340/659 |
| 5,181,091 | A  | * | 1/1993 | Harrington et al. ........... 257/355 |
| 5,247,420 | A  | * | 9/1993 | Bakhoum ...................... 361/212 |
| 5,463,379 | A  | * | 10/1995 | Campbell et al. ............. 340/657 |
| 5,884,240 | A  | * | 3/1999 | Edgar et al. ................... 702/157 |
| 6,111,734 | A  | * | 8/2000 | Harrington et al. ............ 361/56 |
| 7,012,796 | B2 | * | 3/2006 | Chen et al. .................... 361/220 |
| 2006/0261790 | A1 | * | 11/2006 | Tai et al. ....................... 323/274 |
| 2009/0034175 | A1 | * | 2/2009 | Tsai et al. ...................... 361/681 |
| 2009/0041290 | A1 | * | 2/2009 | Yang ............................. 381/396 |
| 2009/0230883 | A1 | * | 9/2009 | Haug ............................. 315/297 |

* cited by examiner

*Primary Examiner* — Benjamin C Lee
*Assistant Examiner* — Stephen Burgdorf
(74) *Attorney, Agent, or Firm* — Altis Law Group, Inc.

(57) ABSTRACT

An electrostatic protector used in a portable electronic device includes an electrostatic conducting unit and an electrostatic protecting unit connected to the electrostatic conducting unit. The electrostatic protecting unit includes at least one protecting circuit, each protecting circuit includes a diode, and the diode has a cathode connected to the electrostatic conducting unit and an anode grounded. Electrostatic charges on the portable electronic device are transmitted to the electrostatic conducting unit and generate a voltage on the cathode of the diode to break down the diode, such that the electrostatic charges are transmitted to the ground via the broken down diode and the voltage on the cathode of the diode is reduced.

13 Claims, 2 Drawing Sheets

ELECTROSTATIC PROTECTOR OF PORTABLE ELECTRONIC DEVICES

BACKGROUND

1. Technical Field

The present disclosure relates to electrostatic protectors, and particularly to a electrostatic protector of portable electronic devices.

2. Description of Related Art

Portable electronic devices, such as mobile phones, personal digital assistants (PDA), laptop computers, are widely used. Most portable electronic devices include metal portions for decoration and/or protection. However, when these portable electronic devices are carried about, electrostatic charges on users may enter the portable electronic devices through outside metal portion and damage circuits.

Therefore, there is room for improvement within the art.

BRIEF DESCRIPTION OF THE DRAWINGS

Many aspects of the present electrostatic protector can be better understood with reference to the following drawings. The components in the various drawings are not necessarily drawn to scale, the emphasis instead being placed upon clearly illustrating the principles of the present electrostatic protector. Moreover, in the drawings, like reference numerals designate corresponding parts throughout the figures.

DETAILED DESCRIPTION

Figure 1:
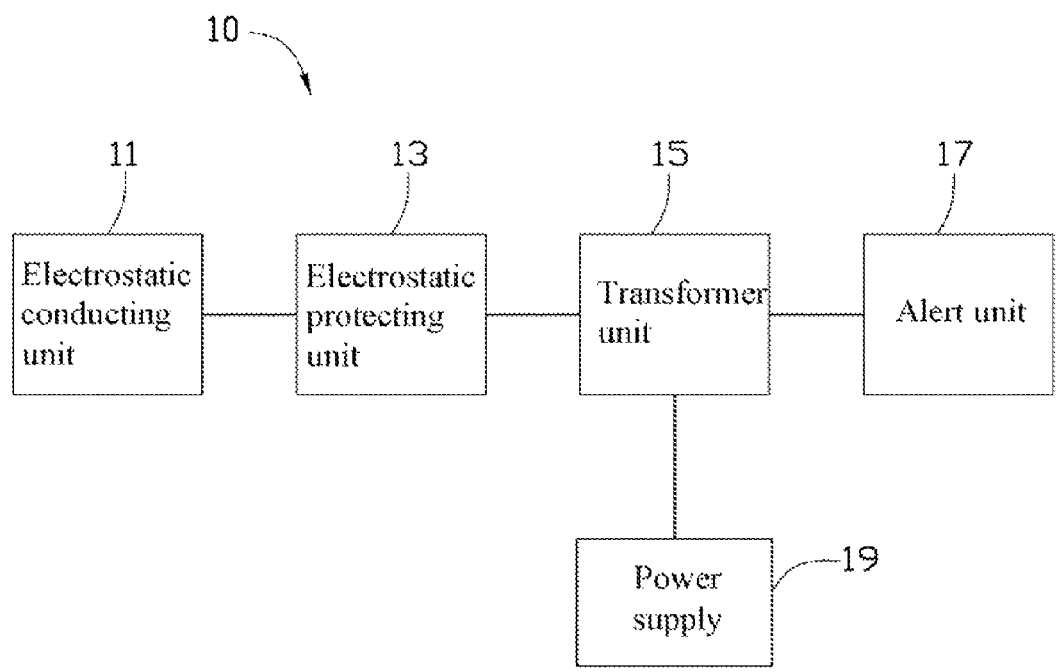
FIG. 1 is a block diagram of an electrostatic protector of portable electronic devices, according to an exemplary embodiment.

FIG. 1 shows an electrostatic protector 10, according to an exemplary embodiment. The electrostatic protector 10 can be used in a portable electronic device, such as a mobile phone, a personal digital assistant (PDA), a laptop computer, etc. The electrostatic protector 10 includes an electrostatic conducting unit 11, an electrostatic protecting unit 13, a transformer unit 15, an alert unit 17, and a power supply 19. The electrostatic conducting unit 11, the electrostatic protecting unit 13, the transformer unit 15, and the alert unit 17 are electrically connected in series. The power supply 19 is electrically connected to the transformer unit 15.

The electrostatic conducting unit 11 is made of conductive materials, such as metal. The electrostatic conducting unit 11 is formed on the outer surface of a housing (not shown) of the portable electronic device, such that the electrostatic charges transmitted to the portable electronic device can be transmitted away by the electrostatic conducting unit 11. Since portable electronic devices generally have many metal portions formed on the housings thereof, the electrostatic conducting unit 11 can be integrated with any of these metal portions. For example, in the present disclosure, the electrostatic conducting unit 11 may include a metal dust-proof net 111, used in the speaker or the microphone of the portable electronic device and a metal keypad 113 of the portable electronic device. Additionally, the electrostatic conducting unit 11 can also work with other metal portions of the portable electronic device, such as metal decorative portions.

Figure 2:
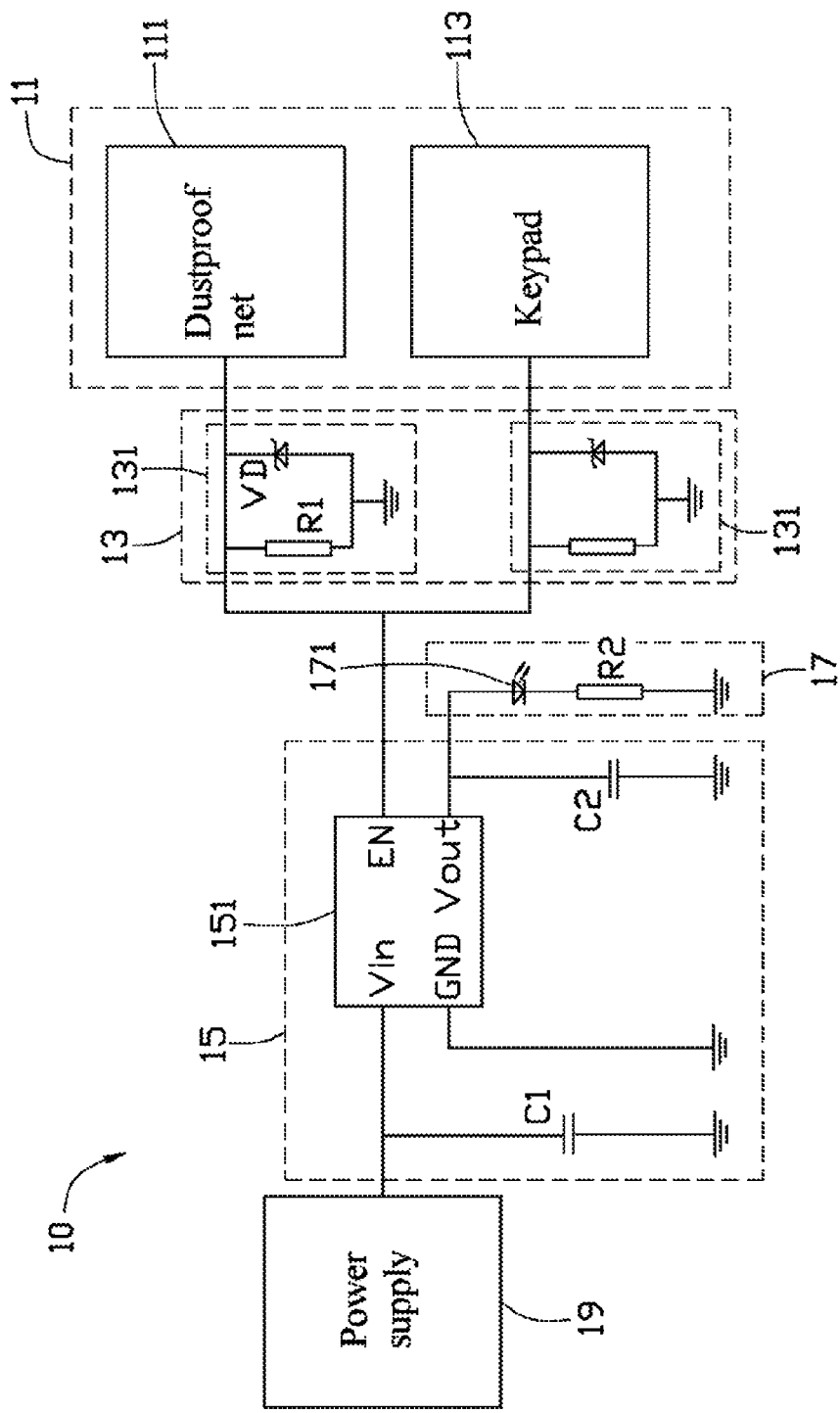
FIG. 2 is a circuit diagram of the electrostatic protector shown in FIG. 1.

Also referring to FIG. 2, the electrostatic protecting unit 13 includes at least one protecting circuit 131. Each protecting circuit 131 includes a resistor R1 and a diode VD. The diode VD is a transient voltage suppressor (TVS) diode. One end of the resistor R1 and the cathode of the diode VD are both connected to the electrostatic conducting unit 11, and another end of the resistor R1 and the anode of the diode VD are both grounded. Different protecting circuits 131 are correspondingly connected to different portions of the electrostatic conducting unit 11. For example, in the present disclosure, the electrostatic protecting unit 13 includes two protecting circuits 131, which are respectively connected to the dust-proof net 111 and the keypad 113 according to the above-detailed method. If the electrostatic conducting unit 11 further includes additional portion(s), more protecting circuit(s) 131 can be added to the electrostatic protecting unit 13 to be correspondingly connected to the additional portion(s) of the electrostatic conducting unit 11.

The transformer unit 15 includes a transformer chip 151, a first capacitor C1, and a second capacitor C2. The transformer chip 151 can be a low dropout regulator (LDO) chip, which includes a grounding connector GND, a voltage input connector Vin, a voltage output connector Vout, and an enable connector EN. The grounding connector GND is grounded. The first capacitor C1 has one pole connected to the power supply 19 and another pole grounded. The second capacitor C2 has one pole connected to the voltage output connector Vout and another pole grounded. The end of the resistor R1 connected to the electrostatic conducting unit 11 and the cathode of the diode VD of each protecting circuit 131 are connected to the enable connector EN.

The alert unit 17 may include a light emitting diode (LED) 171 and a resistor R2. The anode of the LED 171 is connected to the voltage output connector Vout, and the cathode of the LED 171 is connected to the resistor R2. The resistor R2 has one end connected to the cathode of the LED 171 and another end grounded. The power supply 19 can be a conventional supply of the portable electronic device, such as a battery. The power supply 19 is connected to the voltage input connector Vin.

When the portable electronic device having the electrostatic protector 10 installed therein is used, electrostatic charges may be transmitted to the outer surface of the portable electronic device. Since the electrostatic conducting unit 11 is conductive, most electrostatic charges on the outer surface of the portable electronic device are transmitted to the electrostatic conducting unit 11. Thus, the electrostatic charges are transmitted to the protecting circuits 131 that are connected to the portions (such as the dust-proof net 111 or the keypad 113) of the electrostatic conducting unit 11 receiving the electrostatic charges, and thus generate instantaneous voltages on the cathodes of the diodes VD of these protecting circuits 131. Since these instantaneous voltages generated by electrostatic voltages are generally higher than 1000V, the diodes VD are immediately broken down. Thus, the electrostatic charges are transmitted to the ground by the broken down diodes VD and the resistor R1, and the voltages on the cathodes of the diodes VD are reduced to a safe range. In this way, the electrostatic charges are removed, and inner circuits (not shown) of the portable electronic device are protected from being damaged by the high instantaneous voltages generated by the electrostatic charges. The resistor R1 can limit the current passing through the diode VD to protect the diode VD.

In the above-detailed electrostatic removal process, the reduced voltage on the cathode of each diode VD is input to the enable connector EN of the transformer chip 151 to actuate the transformer chip 151. Thus, the electric potential provided by the power supply 19 is input to the transformer chip 151 through the voltage input connector Vin. The transformer chip 151 transforms the input electric potential into a working electric potential of the LED 171 and outputs the transformed electric potential to the anode of the LED 171 through the voltage output connector Vout. The first capacitor C1 and the second capacitor C2 can respectively filter the alternating portions of the electric potential provided by the power supply 19 and the electric potential output from the voltage output connector Vout. Thus, the LED 171 is actuated to emit light, thereby indicating that electrostatic charges are being transmitted to the portable electronic device and the portable electronic device may need to be removed from its current surroundings. The resistor R2 can limit the current passing through the LED 171 to protect the LED 171.

When the present electrostatic protector 10 installed in portable electronic devices, it can indicate electrostatic charges are being transmitted to the portable electronic devices and remove these electrostatic charges. Despite including conductive portions (such as the aforementioned dust-proof net 111 and the keypad 113) that are easy to conduct harmful electrostatic charges, the portable electronic devices are effectively protected, since the electrostatic charges arriving at these conductive portions can be quickly removed.

It is to be further understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. An electrostatic protector used in a portable electronic device, comprising:
   an electrostatic conducting unit;
   an electrostatic protecting unit connected to the electrostatic conducting unit, the electrostatic protecting unit including at least one protecting circuit, each protecting circuit including a diode, the diode having a cathode connected to the electrostatic conducting unit and a grounded anode;
   wherein each protecting circuit further includes a resistor, one end of the resistor grounded, and another end of the resistor connected to the electrostatic conducting unit;
   an alert unit;
   a power supply;
   a transformer unit including a transformer chip, the transformer chip being a low dropout regulator (LDO) chip including a grounding connector, a voltage input connector, a voltage output connector, and an enable connector; the grounding connector grounded, the cathode of the diode connected to the enable connector, the alert unit connected to the voltage output connector, the power supply connected to the voltage input connector;
   wherein electrostatic charges on the portable electronic device are transmitted to the electrostatic conducting unit and generate a voltage on the cathode of the diode to break down the diode, such that the electrostatic charges are transmitted to the ground by the broken down diode and the voltage on the cathode of the diode is reduced; the reduced voltage on the cathode of the diode is input to the enable connector to turn on the transformer chip, the transformer chip transforms an electric potential of the power supply into a working electric potential, and outputs the working electric potential to the alert unit to actuate the alert unit.

2. The electrostatic protector as claimed in claim 1, wherein the diode is a transient voltage suppressor (TVS) diode.

3. The electrostatic protector as claimed in claim 1, wherein the electrostatic conducting unit is made of conductive materials.

4. The electrostatic protector as claimed in claim 3, wherein the electrostatic conducting unit includes metal portions formed on the housing of the portable electronic device.

5. The electrostatic protector as claimed in claim 4, wherein the electrostatic conducting unit includes a dust-proof net of the portable electronic device and a keypad of the portable electronic device, and the electrostatic protecting unit includes two protecting circuits respectively connected to the dust-proof net and the keypad.

6. The electrostatic protector as claimed in claim 1, wherein the alert unit includes a light emitting diode (LED) connected to the voltage output connector, the LED actuated to emit light by the electric potential output by the transformer chip.

7. The electrostatic protector as claimed in claim 6, wherein the alert unit further includes a resistor connected to the LED to limit currents passing through the LED when the LED is actuated.

8. The electrostatic protector as claimed in claim 1, wherein the transformer unit further includes a first capacitor and a second capacitor, the first capacitor having one pole connected to the power supply and another pole grounded, and the second capacitor having one pole connected to the voltage output connector and another pole grounded.

9. An electrostatic protector for use in a portable electronic device, comprising:
   an electrostatic conducting unit;
   an electrostatic protecting unit connected to the electrostatic conducting unit, the electrostatic protecting unit including at least one protecting circuit, each protecting circuit including a diode, the diode having a cathode connected to the electrostatic conducting unit and a grounded anode;
   wherein each protecting circuit further includes a resistor, one end of the resistor grounded, and another end of the resistor connected to the electrostatic conducting unit;
   an alert unit;
   a power supply;
   a transformer unit including a transformer chip; the transformer chip being a low dropout regulator (LDO) chip; the transformer chip connected to the alert unit, the power supply, and the cathode of the diode;
   wherein the electrostatic protector is configured such that electrostatic charges on a portable electronic device are transmitted to the electrostatic conducting unit and generate a voltage on the cathode of the diode to break down the diode, such that the electrostatic charges are transmitted to the ground by the broken down diode and the voltage on the cathode of the diode is reduced; the reduced voltage on the cathode of the diode is input to the transformer chip to turn on the transformer chip, the transformer chip transforms an electric potential of the power supply into a working electric potential to the alert unit to actuate the alert unit.

10. The electrostatic protector as claimed in claim 9, wherein the diode is a transient voltage suppressor (TVS) diode.

11. The electrostatic protector as claimed in claim 9, wherein the electrostatic conducting unit includes metal portions formed on the housing of the portable electronic device.

12. The electrostatic protector as claimed in claim 11, wherein the electrostatic conducting unit includes a dust-proof net of the portable electronic device and a keypad of the portable electronic device, and the electrostatic protecting unit includes two protecting circuits respectively connected to the dust-proof net and the keypad.

13. The electrostatic protector as claimed in claim 9, wherein the transformer chip includes a grounding connector, a voltage input connector, a voltage output connector, and an enable connector; the grounding connector is grounded, the cathode of the diode is connected to the enable connector, the alert unit is connected to the voltage output connector, the power supply is connected to the voltage input connector.

\* \* \* \* \*